(12) United States Patent
Juengling

(10) Patent No.: US 10,607,923 B1
(45) Date of Patent: Mar. 31, 2020

(54) INTEGRATED ASSEMBLIES COMPRISING REDUNDANT WIRING ROUTES, AND INTEGRATED CIRCUIT DECKS HAVING OPENINGS EXTENDING THERETHROUGH

(71) Applicant: Micron Technology, Inc., Boise, ID (US)

(72) Inventor: Werner Juengling, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/213,362

(22) Filed: Dec. 7, 2018

(51) Int. Cl.
| | | |
|---|---|---|
| *H01L 23/48* | (2006.01) | |
| *H01L 23/528* | (2006.01) | |
| *G11C 11/408* | (2006.01) | |
| *H01L 27/108* | (2006.01) | |
| *H01L 25/18* | (2006.01) | |
| *H01L 25/065* | (2006.01) | |
| *H01L 23/532* | (2006.01) | |

(52) U.S. Cl.
CPC ........ *H01L 23/481* (2013.01); *G11C 11/4085* (2013.01); *H01L 23/528* (2013.01); *H01L 25/0657* (2013.01); *H01L 25/18* (2013.01); *H01L 27/10805* (2013.01); *H01L 23/53257* (2013.01); *H01L 2225/06541* (2013.01); *H01L 2225/06565* (2013.01)

(58) Field of Classification Search
None
See application file for complete search history.

(56) References Cited

U.S. PATENT DOCUMENTS

2014/0104938 A1\* 4/2014 Castro ................. H01L 27/2436
365/163

OTHER PUBLICATIONS

U.S. Appl. No. 16/212,418, filed Dec. 6, 2018 by Werner Juengling.

\* cited by examiner

*Primary Examiner* — James G Norman
(74) *Attorney, Agent, or Firm* — Wells St. John P.S.

(57) ABSTRACT

Some embodiments include an integrated assembly having a conductive line supported by a deck and extending along a longitudinal direction. The conductive line is configured to carry an electrical signal. A connection region is along the conductive line. The conductive line splits amongst multiple components as it passes through the connection region. The components are spread-apart from one another along a lateral direction which is orthogonal to the longitudinal direction. An opening extends vertically through the deck and through the connection region. The opening breaks one of the components of the conductive line to leave another of the components to carry the electrical signal across the connection region.

35 Claims, 13 Drawing Sheets

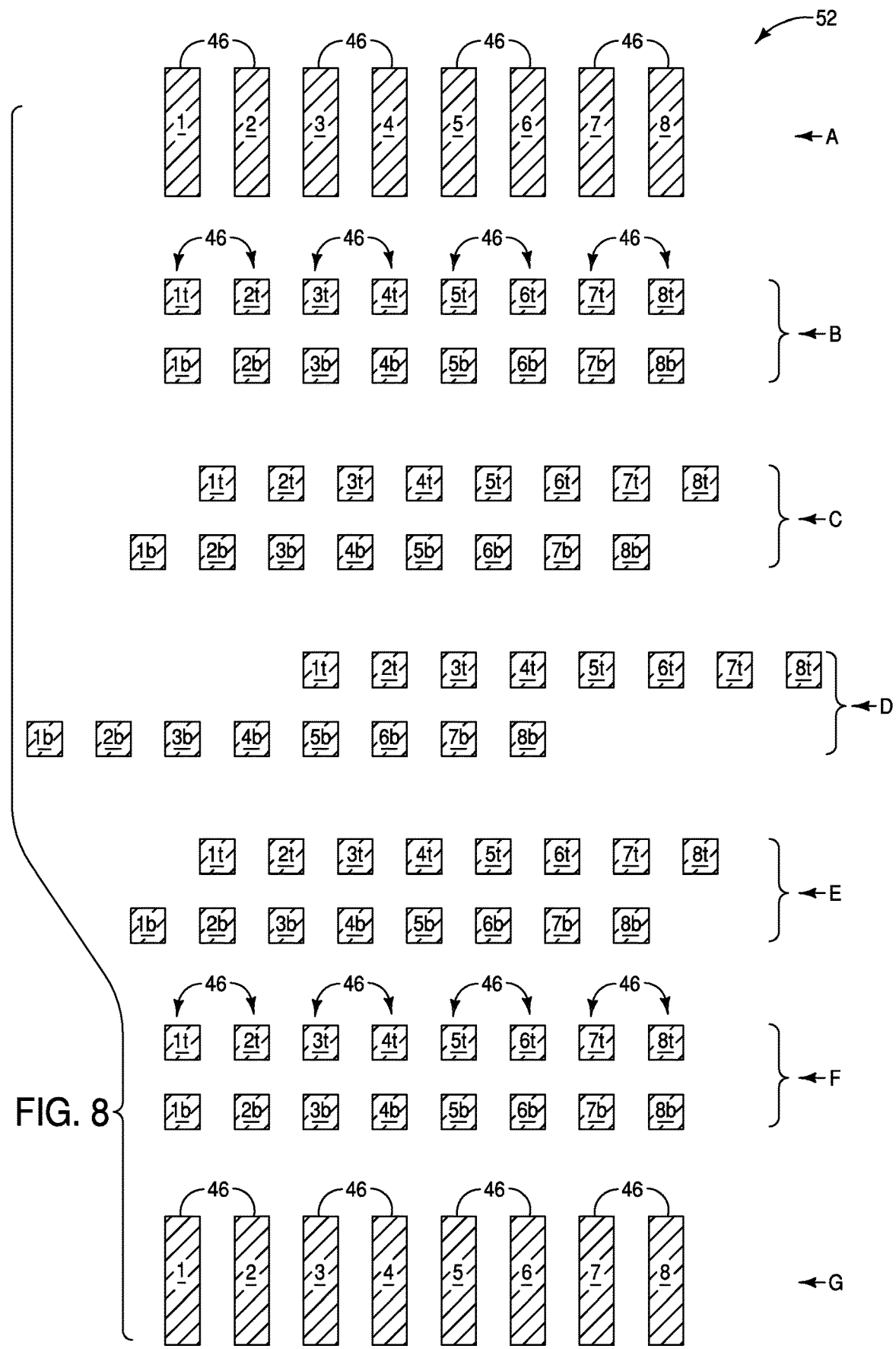

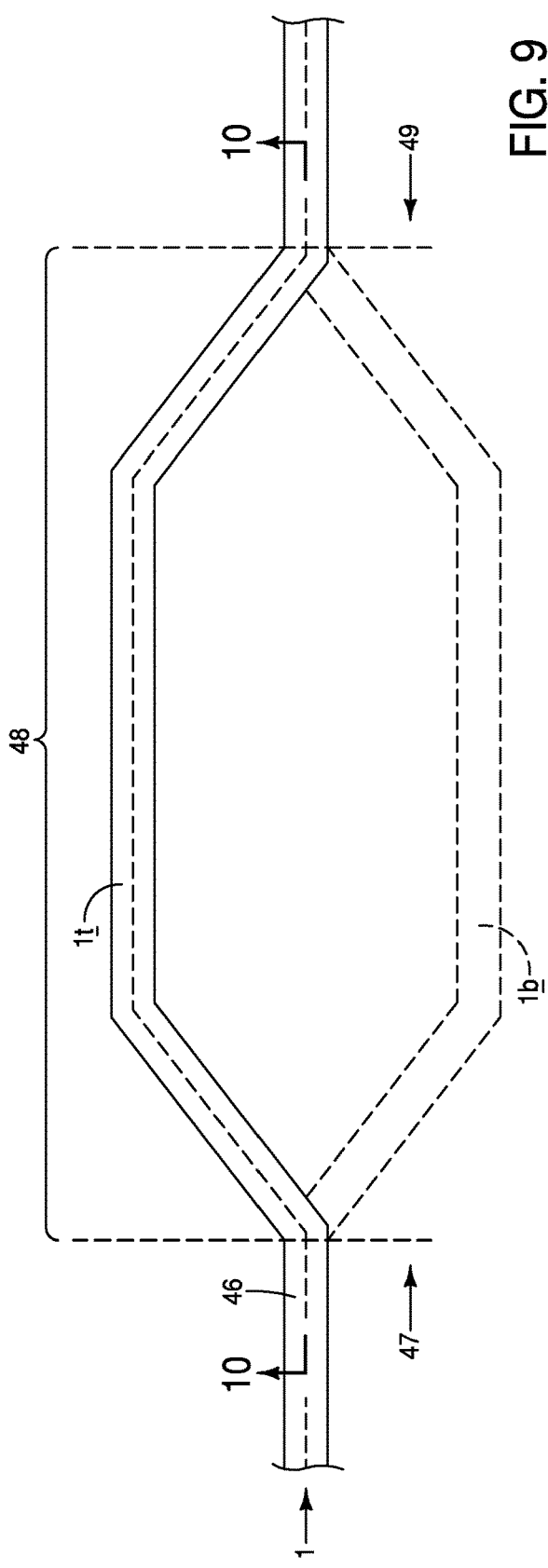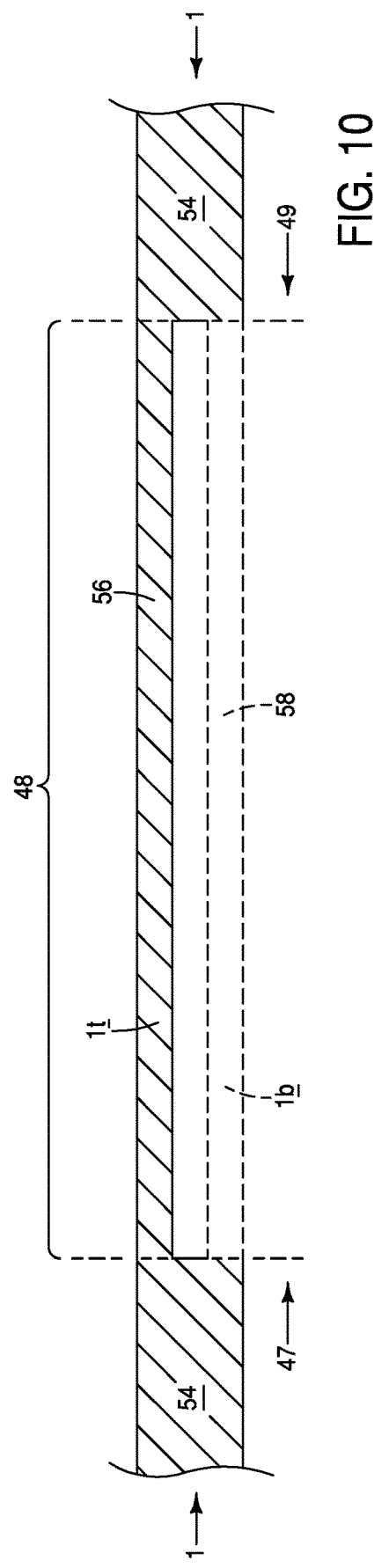

US 10,607,923 B1

INTEGRATED ASSEMBLIES COMPRISING REDUNDANT WIRING ROUTES, AND INTEGRATED CIRCUIT DECKS HAVING OPENINGS EXTENDING THERETHROUGH

TECHNICAL FIELD

Integrated assemblies comprising redundant wiring routes, and integrated circuit decks having openings extending therethrough.

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

DRAM may utilize memory cells which have one capacitor in combination with one transistor (so-called 1T-1C memory cells), with the capacitor being coupled with a source/drain region of the transistor. An example 1T-1C memory cell 2 is shown in FIG. 1, with the transistor labeled T and the capacitor labeled C. The capacitor has one node coupled with a source/drain region of the transistor, and has another node coupled with a common plate, CP. The common plate may be coupled with any suitable voltage, such as a voltage within a range of from greater than or equal to ground to less than or equal to VCC (i.e., ground-≤CP≤VCC). In some applications, the common plate is at a voltage of about one-half VCC (i.e., about VCC/2). The transistor has a gate coupled to a wordline WL (i.e., access line), and has a source/drain region coupled to a bitline BL (i.e., digit-line or sense line). In operation, an electric field generated by voltage along the wordline may gatedly couple the bitline to the capacitor during read/write operations.

Another prior art 1T-1C memory cell configuration is shown in FIG. 2. The configuration of FIG. 2 shows two memory cells 2a and 2b; with the memory cell 2a comprising a transistor T1 and a capacitor C1, and with the memory cell 2b comprising a transistor T2 and a capacitor C2. Wordlines WL0 and WL1 are electrically coupled with the gates of transistors T1 and T2, respectively. A connection to a bitline BL is shared by the memory cells 2a and 2b.

The memory cells described above may be incorporated into memory arrays, and in some applications the memory arrays may have open bitline arrangements. An example integrated assembly 9 having open bitline architecture is shown in FIG. 3. The assembly 9 includes two laterally adjacent memory arrays ("Array 1" and "Array 2"), with each of the arrays including memory cells of the type described in FIG. 2 (not labeled in FIG. 3 in order to simplify the drawing). Wordlines WL0-WL7 extend across the arrays, and are coupled with wordline drivers. Digit-lines D0-D8 are associated with the first array (Array 1), and digit-lines D0*-D8* are associated with the second array (Array 2). Sense amplifiers SA0-SA8 are provided between the first and second arrays. Digit-lines at the same height are paired within one another and compared through a sense amplifier (e.g., digit-lines D0 and D0* are paired with one another and compared with the sense amplifier SA0). In a read operation, one of the paired digit-lines may serve as a reference in determining electrical properties (e.g., voltage) of the other of the paired digit-lines.

A continuing goal of integrated circuit fabrication is to increase integration. There is interest in stacking decks (tiers) of integrated circuitry to achieve high integration. However, it is proving difficult to couple circuitry from upper decks with the circuitry of lower decks, particularly since there is generally at least some risk of misalignment of the decks. It would be desirable to develop three-dimensional arrangements enabling coupling of the circuitry from upper decks to lower decks, and enabling the ability to correct for possible misalignment.

BRIEF DESCRIPTION OF THE DRAWINGS

FIG. 8 shows diagrammatic cross-sectional side views along the lines A-A, B-B, C-C, D-D, E-E, F-F and G-G of FIG. 7.

FIG. 9 is a plan view of an example layout of wiring.

FIG. 10 is a diagrammatic cross-sectional side view along the line 10-10 of FIG. 9.

DETAILED DESCRIPTION OF THE ILLUSTRATED EMBODIMENTS

Some embodiments include integrated assemblies which have conductive lines extending through a connection region. The conductive lines are split into multiple components within the connection region. An opening extends through the connection region and breaks one or more of the components. Remaining components carry signals across the connection region. Example embodiments are described with reference to FIGS. 4-17.

Figure 4:
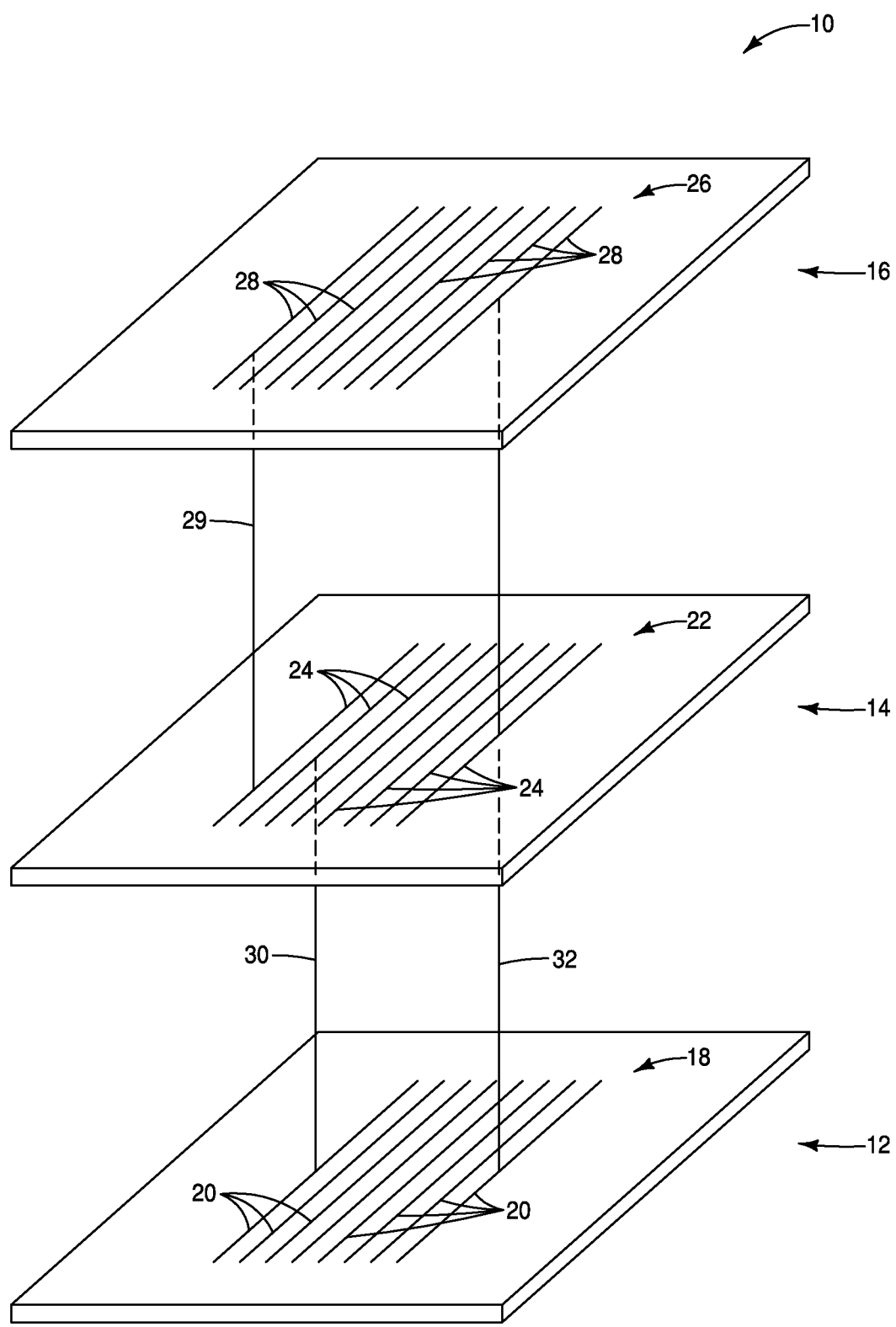
FIG. 4 is a schematic diagram of an example integrated assembly having multiple decks which are vertically displaced relative to one another.

Referring to FIG. 4, an integrated assembly 10 includes a base 12, a first deck 14 over the base, and a second deck 16 over the first deck. The base 12, deck 14 and deck 16 may be considered to be examples of levels that are stacked one atop the other. The levels may be within different semiconductor dies, or at least two of the levels may be within the same semiconductor die.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate"

refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc. The decks 14 and 16 may also comprise semiconductor material.

The structure 12 is referred to as a "base" because it is below the decks 14 and 16. The structure 12 may be alternatively referred to as a deck. The structure 12 may be a bottommost deck of an assembly (as shown), or there may be additional decks beneath the illustrated structure 12. Also, there may be additional decks over the structure 16.

The base 12 supports circuitry 18, with such circuitry being represented by a plurality of conductive lines (e.g., wiring lines) 20. The circuitry 18 may be referred to as first circuitry.

The deck 14 supports circuitry 22, with such circuitry being represented by a plurality of conductive lines (e.g., wiring lines) 24. The circuitry 22 may be referred to as second circuitry.

The deck 16 supports circuitry 26, with such circuitry being represented by a plurality of conductive lines (e.g., wiring lines) 28. The circuitry 26 may be referred to as third circuitry.

Figure 5:
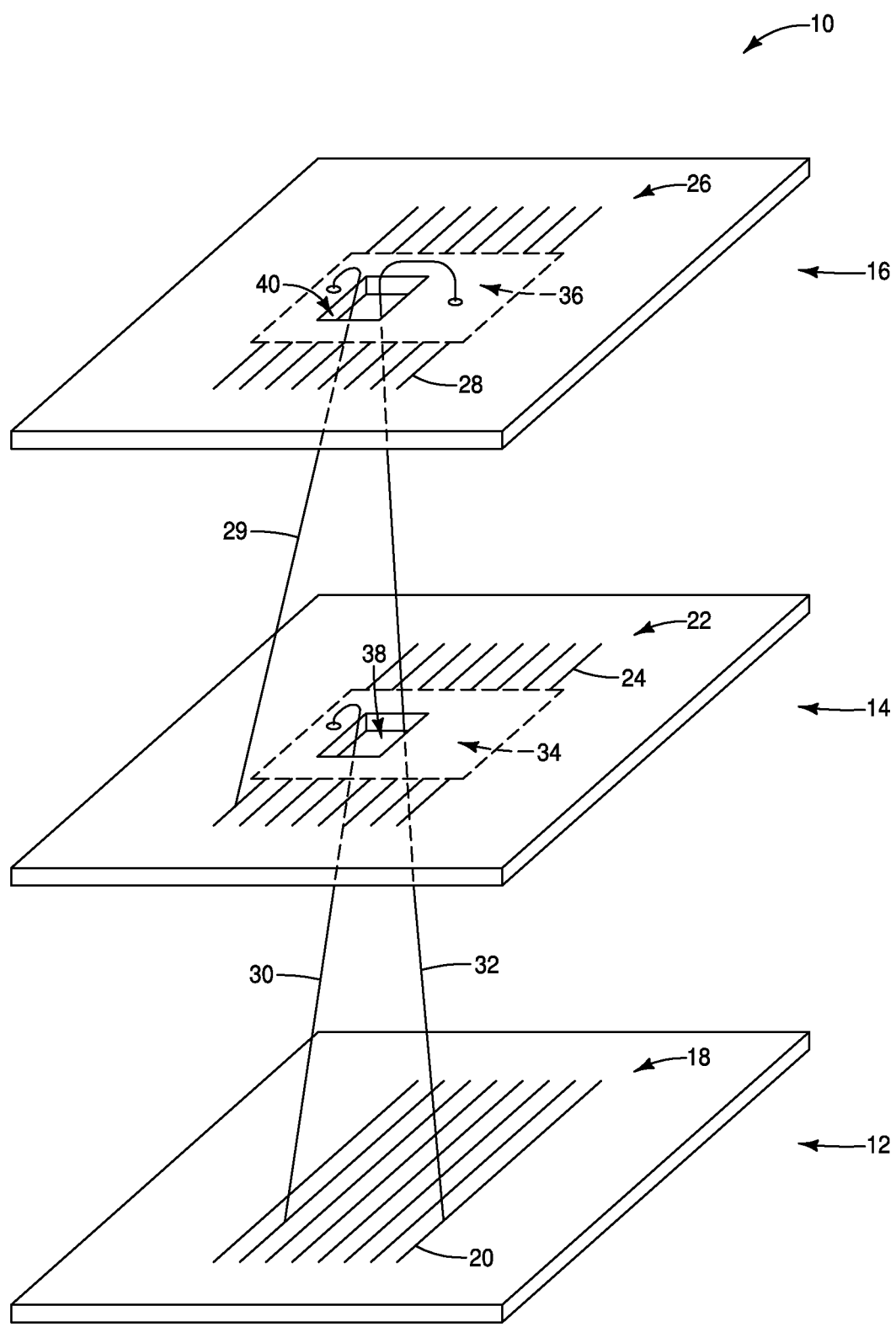
FIG. 5 is a schematic diagram of another example integrated assembly having multiple decks which are vertically displaced relative to one another.

Embodiments described herein pertain to architectures which enable wiring associated with an upper deck (e.g., deck 14 and/or deck 16) to be coupled to wiring of a lower deck (e.g., base 12). FIG. 4 shows an example interconnect 30 which is indicated to couple a line 24 of the second circuitry 22 with a line 20 of the first circuitry 18, and shows an example interconnect 32 which is indicated to couple a line 28 of the third circuitry 26 with a line 20 of the first circuitry 18. Unfortunately, the interconnect 30 needs to pass through the deck 14, and the interconnect 32 needs to pass through both of the decks 14 and 16. If the circuitry associated with the decks is highly integrated (i.e., tightly packed) it can be difficult to find regions of the decks suitable for forming the openings needed for passing the interconnects 30 and 32 through the decks. FIG. 5 shows the assembly 10 in a configuration which shows a solution to the problem in accordance with some embodiments of the invention described herein. Specifically, connection regions (or pass-thru regions) 34 and 36 are formed along the decks 14 and 16, respectively; and openings 38 and 40 are formed to pass through the regions 34 and 36.

The connection regions 34 and 36 provide redundancy along the circuitry 22 and 26 so that openings 34 and 36 may be formed without sacrificing the ability of the individual wires of the circuitry (i.e., the wires 24 of the circuitry 22, and the wires 28 of the circuitry 26) to carry signals. The signals may be electrical signals; such as, for example, current, voltage, etc.

FIGS. 4 and 5 show an additional interconnect 29 coupling the circuitry 22 of the deck 14 with the circuitry 26 of the deck 16. Similar problems are encountered in passing the interconnect 29 through the deck 16 as are encountered in passing the interconnects 30 and 32 through the decks 14 and 16; and similar solutions may be utilized as are described relative to the interconnects 30 and 32.

Although three decks 12, 14 and 16 are shown in FIGS. 4 and 5, it is to be understood that the embodiments described herein may be applied to the construction of three-dimensional architectures having only two decks (e.g., decks 12 and 14), or having more than three decks.

Figure 6:
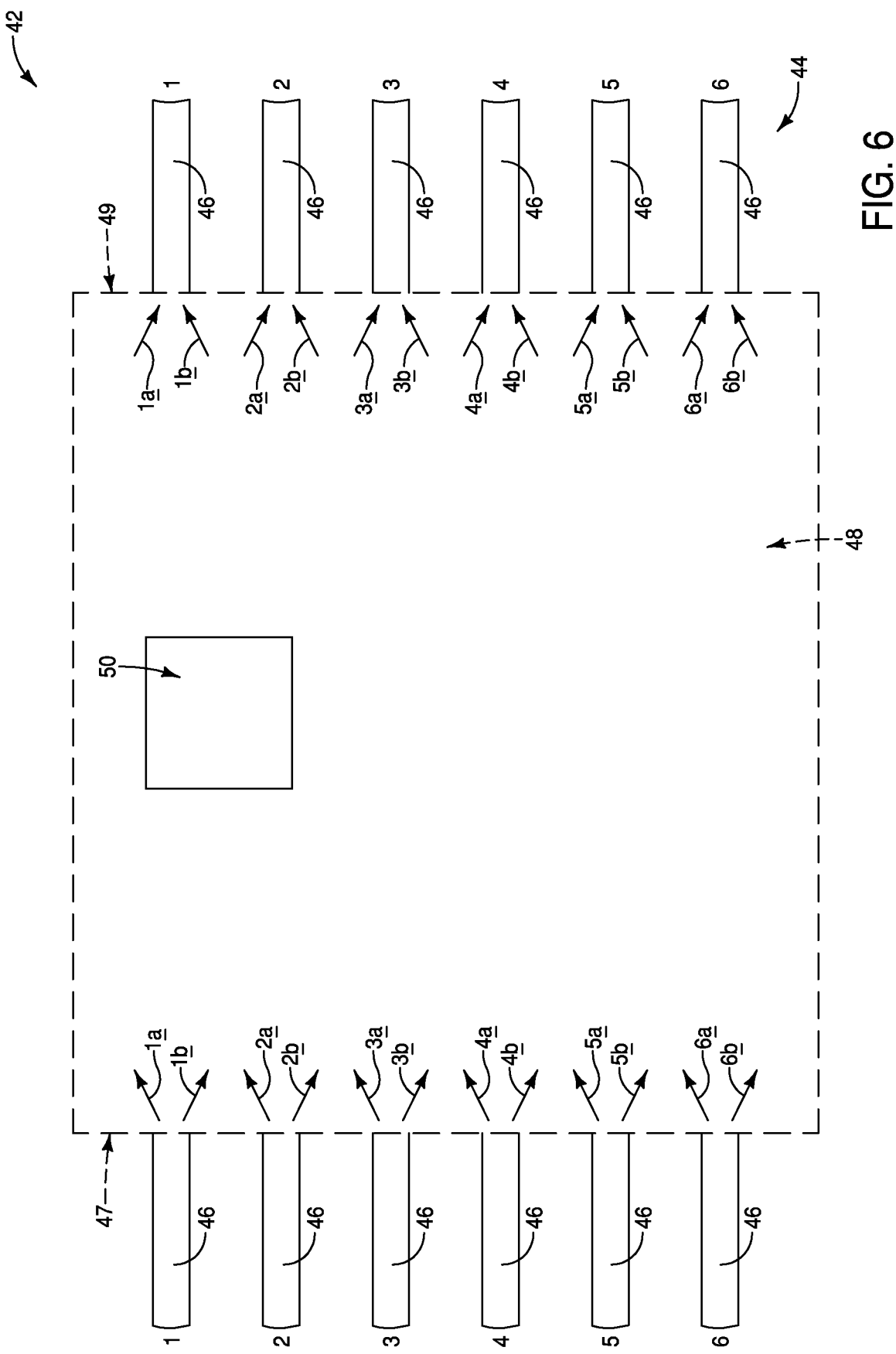
FIG. 6 is a schematic diagram of an example layout of wiring.

FIG. 6 diagrammatically illustrates an example connection region 48. Specifically, FIG. 6 shows an integrated assembly 42 having a circuit 44 containing wires 46, with the wires passing through the connection region 48. Each wire has a first end which is proximate a first side 47 of the connection region, and has a second end which is proximate a second side 49 of the connection region. The individual wires 46 are labeled as 1, 2, 3, 4, 5 and 6 so that the wires may be readily identified on each side of the connection region 48.

Within the connection region 48, the wires are each split amongst multiple redundant paths. In the shown embodiment each wire bifurcates amongst two paths, with one of the paths being an "a-path" (or first path) and the other being a "b-path" (or second path). For instance, the wire 1 splits to follow both an "a-path" labeled 1a and a "b-path" labeled 1b.

An opening 50 is formed to pass through the connection region 48. As long as the opening only breaks one of the two paths for any of the conductive lines 46, then all of the conductive lines will be able to carry electrical signals across the connection region. For instance, if the path 1a is broken, the wire 1 will still be able to carry electrical signal across the connection region 48 via the path 1b.

In some embodiments, the connection region 48 may be considered to provide redundancies along the various wires of a circuit to enable the wires to carry electrical signals around one or more openings that may be formed through the connection region.

Although the structures 46 are described as wires configured to carry electrical signals, it is to be understood that in some embodiments the structures 46 may be generically considered to be any configuration of signal carrier structures (e.g., waveguides) configured to carry any suitable signals (e.g., electromagnetic radiation) associated with integrated circuitry.

Figure 7:
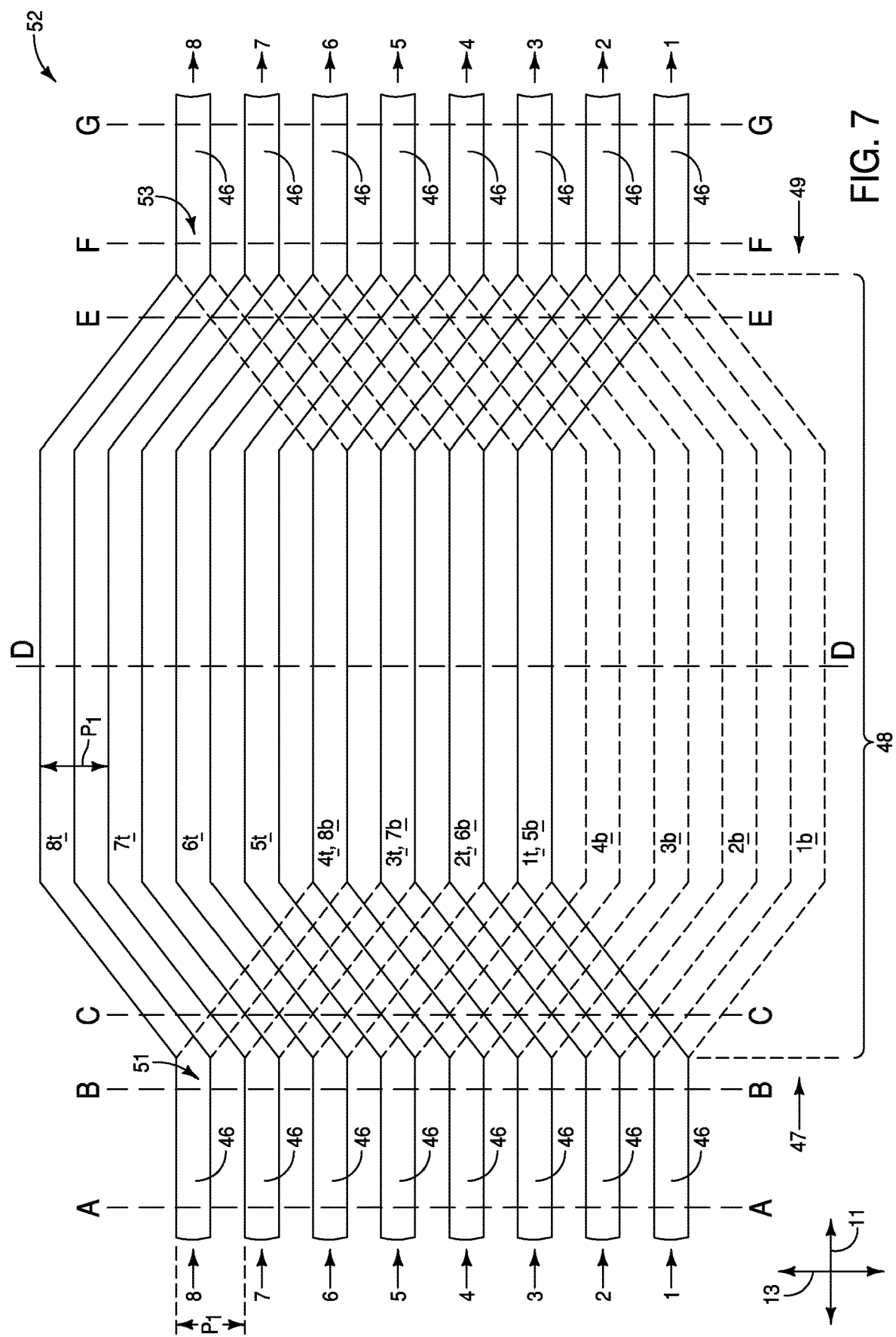
FIG. 7 is a plan view of an example layout of wiring.

FIGS. 7 and 8 show another assembly 52 comprising a connection region 48, and illustrate an example configuration of the redundancies across the connection region. FIG. 7 is a top view (or plan view) of the connection region, and FIG. 8 shows cross-sections along the lines A-A, B-B, C-C, D-D, E-E, F-F and G-G of FIG. 7.

Conductive lines 46 (or other suitable carrier structures) pass through the connection region 48. The conductive lines are labeled 1, 2, 3, 4, 5, 6, 7 and 8 so that the lines may be readily identified on each side of the connection region 48. In some embodiments, each of the conductive lines may be referred to as a wiring line. In the shown embodiment, the conductive lines are parallel to one another on either side of the connection region 48, and are on a pitch $P_1$. The lines 46 may be supported by a deck, such as, for example, one of the decks 14 and 16 of FIG. 5. Accordingly, the connection region 48 may be representative of one of the connection regions 34 and 36 described previously with reference to FIG. 5.

The conductive lines 46 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

Each of the lines 46 has a first end proximate the first side 47 of the connection region 48, and has a second end proximate the second side 49 of the connection region. The first and second ends of the lines are along the cross-sections B-B and F-F, respectively; with the first end of the uppermost line of FIG. 7 (i.e., line 8) being labeled 51, and the second end of such uppermost line being labeled 53.

Each of the lines 46 bifurcates into a pair of components as it passes through the connection region 48. Specifically, line 1 is split amongst the components 1t and 1b; line 2 is split amongst the components 2t and 2b; line 3 is split amongst the components 3t and 3b; line 4 is split amongst the components 4t and 4b; line 5 is split amongst the components 5t and 5b; line 6 is split amongst the components 6t and 6b; line 7 is split amongst the components 7t and 7b; and line 8 is split amongst the components 8t and 8b.

In some embodiments, the lines 46 may be considered to extend along a first direction (or longitudinal direction); with such first direction being along the axis 11 shown in FIG. 7. The paired components of each of the lines (e.g., the paired components 1b and 1t of the line 1) are spread-apart from one another along a second direction (or lateral direction) which is orthogonal to the first direction; with such second direction being along the axis 13 shown in FIG. 7. In the shown embodiment, the spread-apart components (e.g., 1t, 1b, 2t, 2b, etc.) are on the same pitch $P_1$ as the lines 46. In other embodiments, the spread-apart components may be on a different pitch relative to the pitch of the lines 46.

FIG. 8 shows that the paired components of each of the lines 46 are vertically offset relative to another. For instance, the components 1t and 1b of the line 1 are vertically offset, with the component 1t being a top component and the component 1b being a bottom component. The top and bottom components may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the top and bottom components of the individual lines (e.g., the top and bottom components 1t and 1b of the line 1) may comprise the same composition as one another (e.g., may both comprise metal, such as, for example, one or both of titanium nitride and tungsten), and in other embodiments they may comprise different compositions relative to one another (e.g., may comprise different metals relative to one another; such as, for example, one may comprise titanium while the other comprises tungsten).

Figure 1:
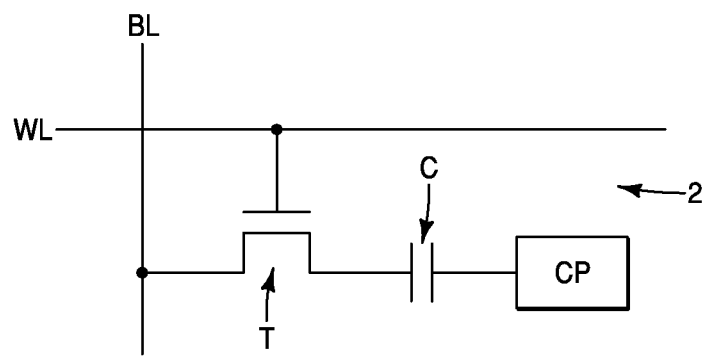
FIG. 1 is a schematic diagram of a prior art memory cell having 1 transistor and 1 capacitor.

Referring to FIG. 8, the cross-sections along A-A and G-G of FIG. 1 show each of the conductive lines 46 to be a monolithic structure. The cross-sections along B-B and F-F (i.e., the cross-sections at the edges of the connection region 48) show the lines 46 to now be split into the vertically-spaced components (e.g., line 1 is split into the top and bottom components 1t and 1b). The cross-sections along C-C and D-D show the vertically-spaced components being spread laterally relative to one another (e.g., the top component 1t is spread so that it is no longer directly over the bottom component 1b). The cross-section along D-D shows the vertically-spaced components at their full lateral spread within the connection region 48. In the illustrated embodiment, the top component from one line (i.e., a first line) is directly over the bottom component of another line (i.e., a second line) along the cross-section D-D (e.g., the top component 1t of line 1 is directly over the bottom component 5b of line 5).

In some embodiments, the conductive lines 46 may be wordlines, and the components 1b, 1t, etc., may be referred to as wordline components. For instance, FIG. 16 (discussed below) shows an example embodiment in which connection regions analogous to the connection region 48 are formed along wordlines.

FIGS. 9 and 10 show the line 1 in isolation from the other lines to further illustrate the relationship between the top and bottom components 1t and 1b. FIG. 9 shows a top view of the line 1, and shows the bottom component 1b in dashed-line view to indicate that it is below the top component 1t. FIG. 10 shows a view along the section 10-10 of FIG. 9, or in other words shows a view along the top component 1t. The bottom component 1b is shown in dashed-line view in FIG. 10 to illustrate that it is out of the plane relative to the cross-section of FIG. 10. The components 1b and 1t of FIG. 10 are shown to be vertically-offset relative to one another, and to join to one another proximate the ends 47 and 49 of the connection region 48.

FIG. 10 shows the line 1 comprising a material 54 outside of the connection region 48, shows the top component 1t comprising a material 56, and shows the bottom component 1b comprising a material 58. In some embodiments, the materials 54, 56 and 58 may all be the same composition as one another (i.e., may all comprise the same metal; and in some embodiments may all comprise one or both of tungsten and titanium nitride). In some embodiments, at least one of the materials 54, 56 and 58 may comprise a composition which is different than the composition of at least one other of the materials 54, 56 and 58.

Figure 11:
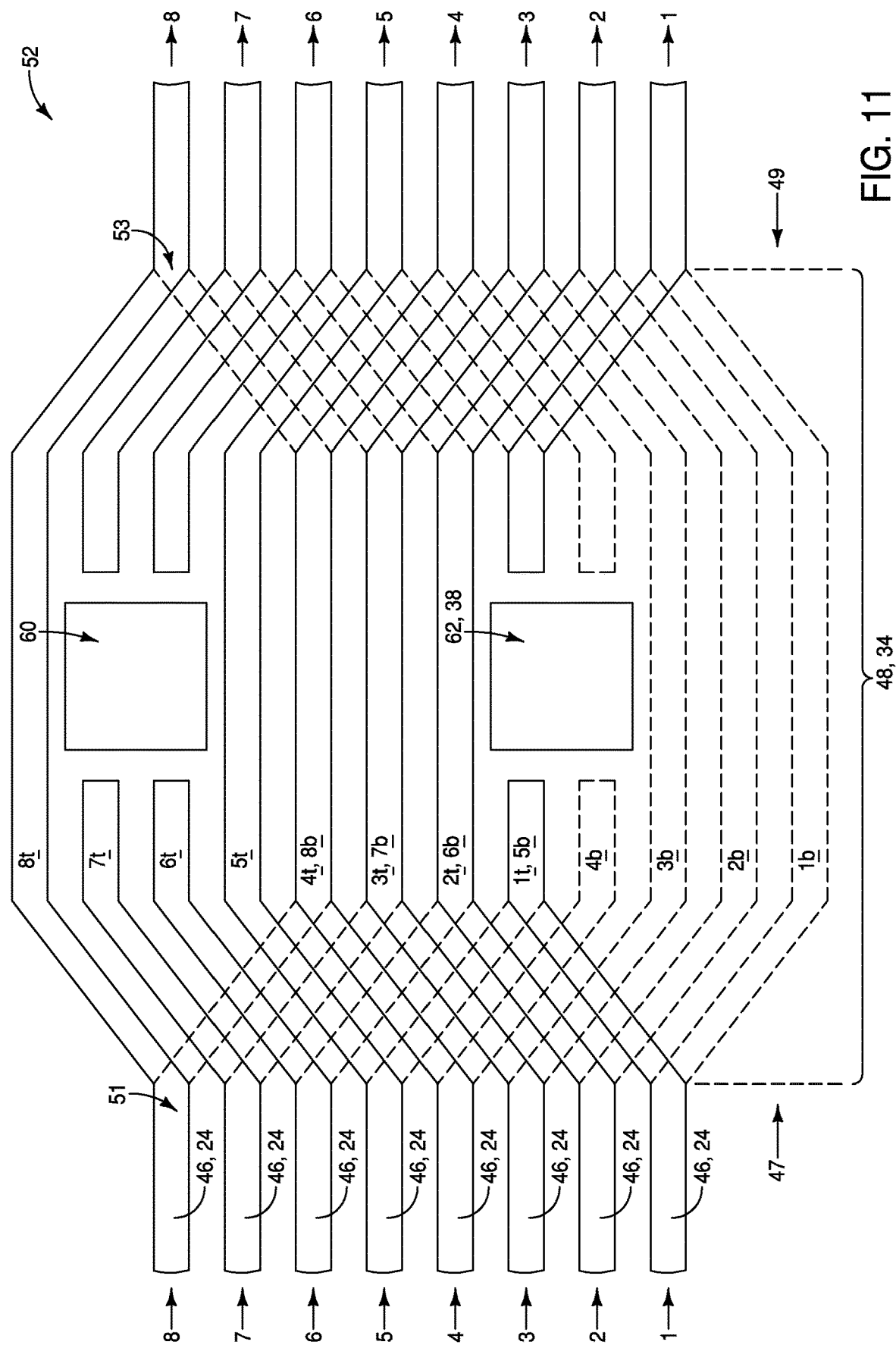
FIGS. 11-15 are plan views of example layouts of wiring.

Referring again to FIGS. 7 and 8, the splitting of the lines 46 into the spread-apart components within the connection region 48 (e.g., the splitting of the line 1 into the spread-apart components 1t and 1b) provides redundancy which can enable an opening to be passed through the connection region 48 without completely breaking any of the lines 46. Instead, the opening can be fabricated so that it only breaks one of the components of a line, while leaving the other of the components available to carry signal (e.g., an electrical signal, such as voltage, current, etc.) across the connection region. For instance, FIG. 11 shows the assembly 52 having two openings 60 and 62 passing therethrough. In some embodiments, the assembly 52 may be along a deck (e.g., one of the decks 14 and 16 of FIG. 5), and the openings 60 and 62 may extend vertically through the assembly 52.

The opening 60 cuts the components 6t and 7t; and the opening 62 cuts the components 1t, 5b and 4b. However, the components 1b, 2b, 3b, 6b, 7b, 8b, 2t, 3t, 4t, 51 and 8t remain to carry signals across the connection region 48. Thus, each of the lines 1, 2, 3, 4, 5, 6, 7 and 8 has at least one component remaining to carry signal across the connection region 48. The number of openings formed through the connection region 48, sizes of the openings, and spacings between the openings, may be tailored so that each line passing into the connection region 48 will have at least one component remaining to carry signal across the connection region.

The illustrated embodiment of FIG. 11 shows eight lines 46 passing through the connection region 48. It is to be understood that such is a general representation of the concept of the connection region, and that in other embodiments a different number of lines may be passed through an analogous connection region. For instance, in some embodiments there may be fewer than eight lines passing through a connection region, or more than eight lines passing through the connection region. For instance, in some embodiments there may be 16 lines, 32 lines, 64 lines, etc., passing through a connection region.

Figure 12:
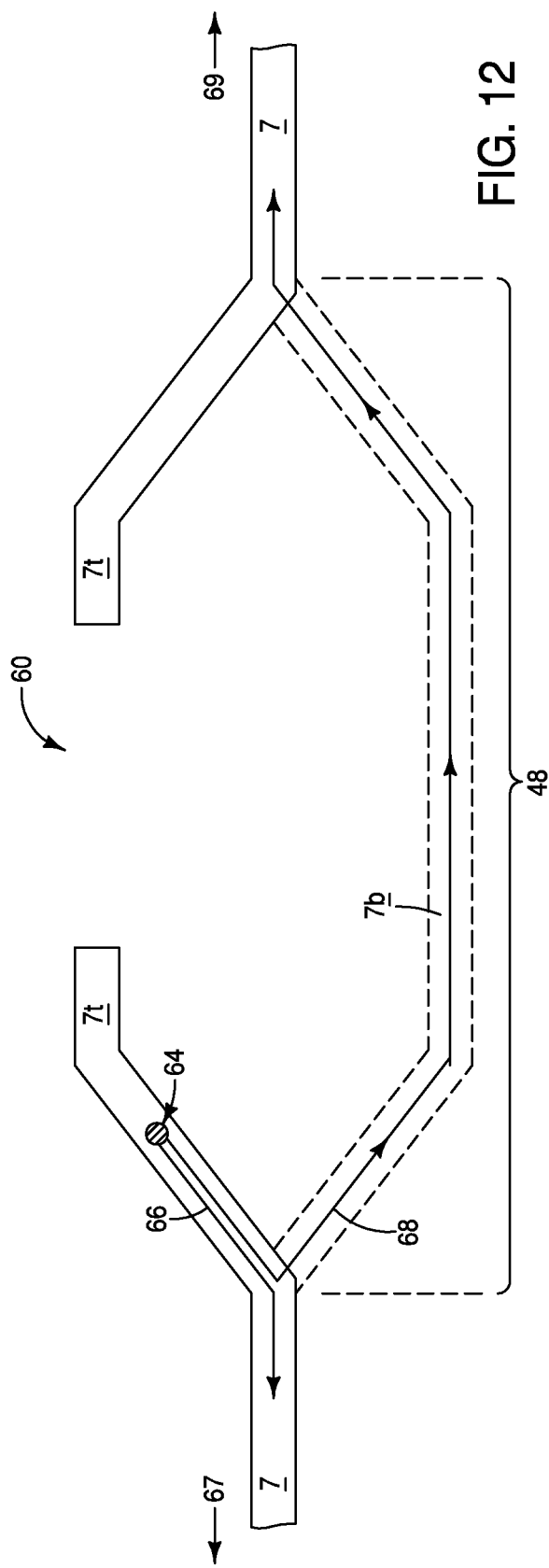

FIG. 12 shows the line 7 in isolation from the remainder of the lines of FIG. 11 to illustrate the advantageous redundancy provided by the components 7b and 7t. The opening 60 breaks the component 7t, while leaving the component 7b to conduct signal across the connection region 48. An interconnect 64 is diagrammatically illustrated to be coupled with the component 7t. Conductive paths 66 and 68 are provided to show that signal from the interconnect 64 may be carried in either direction along the line 7. Specifically, the path 66 carries the signal along a first direction 67, and the path 68 carries the signal along a second direction 69. It is noted that the paths 66 and 68 may reversed to carry signal along the line and toward the interconnect 64.

Referring again to FIG. 11, alternative numbering is provided in the figure to match the numbering associated with the deck 14 of FIG. 5. Accordingly, the connection region 48 of FIG. 11 may be alternatively considered to be the region 34 described above with reference to FIG. 5, the lines 46 of FIG. 11 may be alternatively considered to be the lines 24 of FIG. 5, and the opening 62 of FIG. 11 may be alternatively considered to be the opening 38 of FIG. 5. In some embodiments, FIG. 5 may be considered to show a first deck 12 comprising first circuitry 18, and a second deck 14 over the first deck. The second deck comprises lines 24 of wiring. The connection region 34 is along the lines. Each of the lines has a first end 51 (FIG. 11) on one side 47 (FIG. 11) of the connection region, and a second end 53 (FIG. 11) on a second side 49 (FIG. 11) of the connection region. Each of the lines bifurcates into paired components as it passes through the connection region (with example paired components 1b, 1t, etc. being shown in FIG. 11). The paired components spread-apart from one another. The opening 38 passes through the second deck 14 (FIG. 5) and through the connection region 34, and breaks one of the paired components (e.g., 7t) of at least one of the lines (e.g., line 7), while leaving the other of the paired components (e.g., 7b) to carry a signal across the connection region. A vertical interconnect (e.g., 30 of FIG. 5) is electrically coupled with the first circuitry 18 of the first deck 12 (shown in FIG. 5), extends through the opening 34, and is electrically coupled with an individual of the components passing through the connection region (with such connection being diagrammatically illustrated in FIG. 5, with an example interconnect 64 being shown in FIG. 12, and with an example connection being described in more detail below with reference to FIG. 17).

The first circuitry 18 of FIG. 5 may be any suitable circuitry, and in some embodiments may be wordline-driver-circuitry. The second circuitry 22 of FIG. 5 may be any suitable circuitry, and in some embodiments may be wordlines associated with one or more memory arrays.

The embodiment of FIG. 5 shows a second vertical interconnect 32 passing through the connection region 34 and coupling the first circuitry 18 with third circuitry 26 of a third deck 16. The second vertical interconnect passes through an opening 40 in the third deck 16. The opening 40 extends through a connection region 36 which may be analogous to the connection region 48 of FIG. 11. In some embodiments, the conductive lines 24 associated with the second deck 14 may be referred to as first lines, and the conductive lines 28 associated with the third deck 16 may be referred to as second lines. The opening 40 may be considered to be a second opening which extends through a second connection region 36, and the vertical interconnect 32 may be considered to be a second vertical interconnect which extends through the second opening to couple with one of the second lines 28.

In some embodiments, the circuitry 18 of FIG. 5 may be wordline-driver-circuitry, and the first and second lines 24 and 28 may be wordlines associated with memory arrays along the second and third decks 14 and 16.

Figure 13:
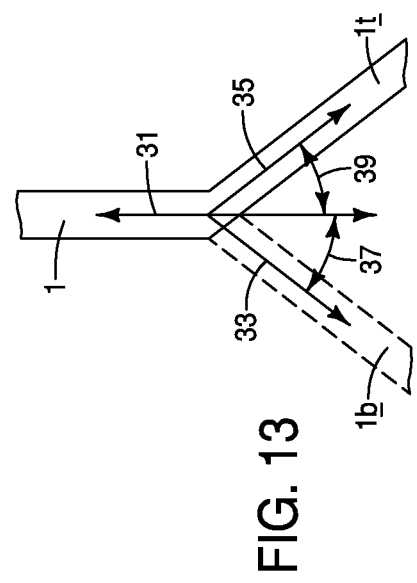

The splitting of the lines 46 into the illustrated components (e.g., the splitting of the line 1 into the components 1b and 1t) may comprise any suitable angles between the lines and the components. FIG. 13 shows a portion of the line 1 splitting into the components 1t and 1b. The line 1 extends along a first axis 31, and the components 1b and 1t extend along second and third axes 33 and 35, respectively. A first angle 37 is between the first and second axes 31 and 33: and a second angle 39 is between the first and third axes 31 and 35. In some embodiments the first and second angles 37 and 39 may be substantially the same as one another (with the term "substantially the same" meaning the same to within reasonable tolerances of fabrication and measurement), and in other embodiments the first and second angles 37 and 39 may be different relative to one another. The angles 37 and 39 may be any suitable angles to achieve desired redundancy within the connection region 48 (FIG. 11) while maintaining the desired tight-packing associated with high integration. In some embodiments, the angles 37 and 39 may be within a range of from greater than about 0° to less than or equal to about 80°; within a range of from about 10° to about 60°; etc.

Figure 14:
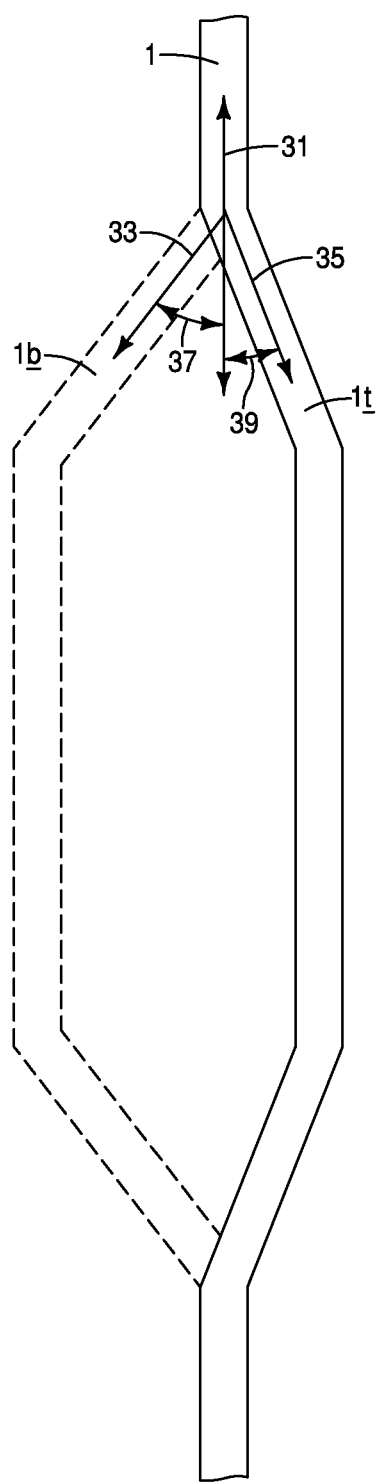
Figure 15:
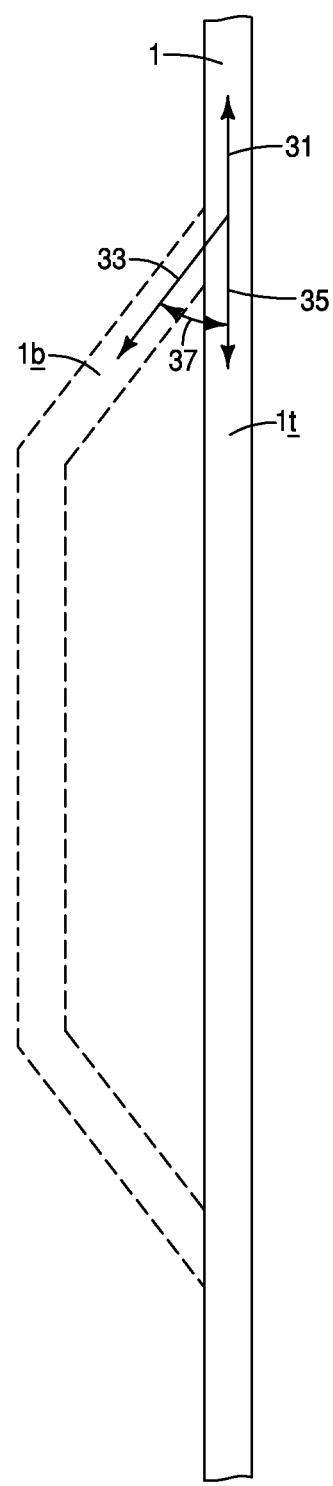

FIG. 13 shows an embodiment in which the angles 37 and 39 are about the same as one another. FIGS. 14 and 15 show alternative embodiments in which the angles 37 and 39 are not the same as one another.

FIG. 14 shows an embodiment in which the line 1 splits into the components 1b and 1t; and shows the first, second and third axes 31, 33 and 35 described above with reference to FIG. 13, together with the angles 37 and 39. In contrast to the embodiment of FIG. 13, the angles 37 and 39 of FIG. 14 are different relative to one another.

FIG. 15 shows another embodiment in which the angles 37 and 39 (the angle 39 is not labeled in FIG. 15) are different relative to one another, and shows an embodiment in which the angle 39 (not labeled in FIG. 15) is about 0° (or, alternatively considered, about) 180°.

Figure 16:
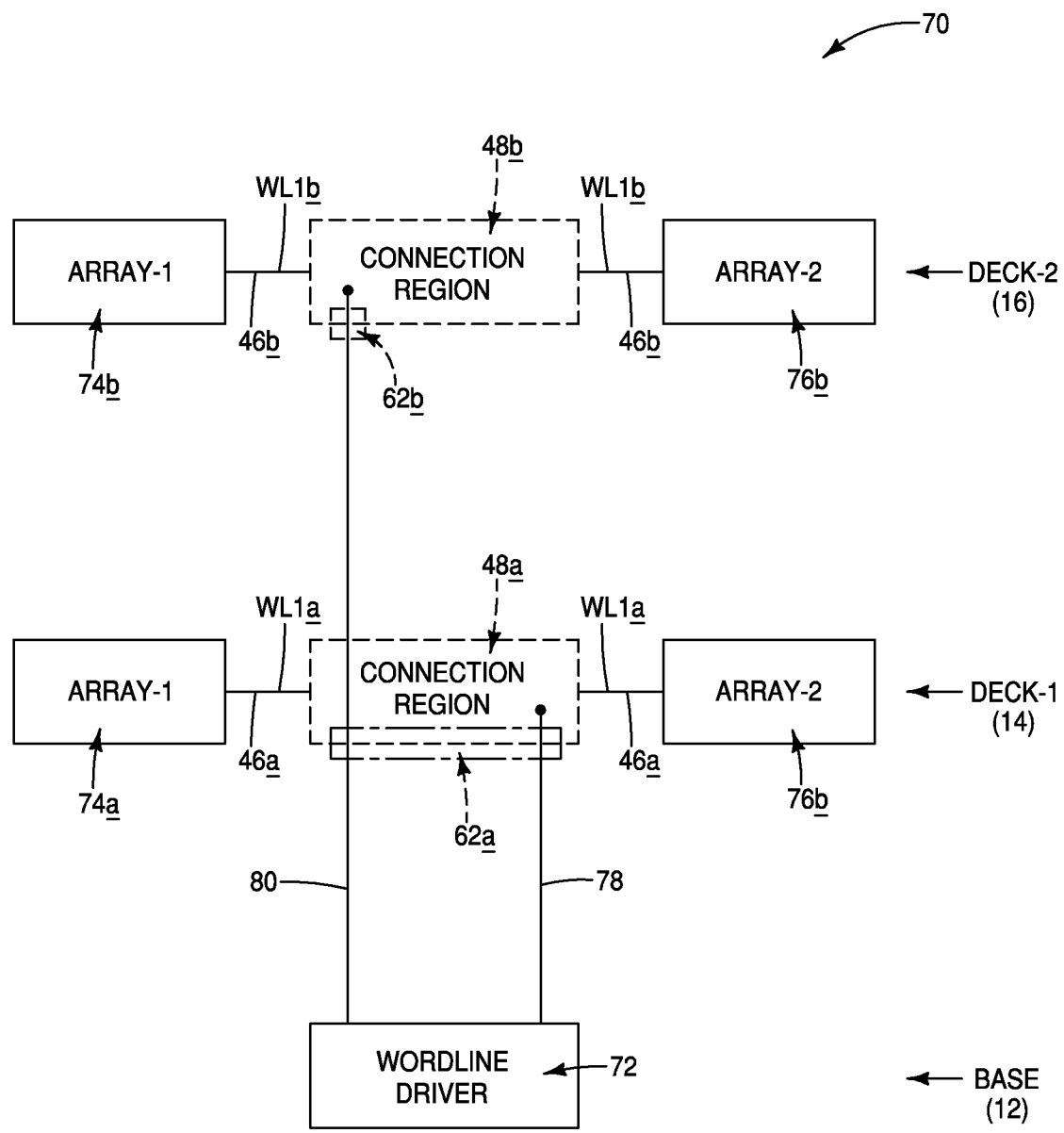
FIG. 16 is a schematic diagram of another example integrated assembly having multiple decks which are vertically displaced relative to one another.

The connection regions described above may be utilized in any suitable applications. FIG. 16 shows an integrated assembly 70 illustrating an example application in which the connection regions are utilized for connecting wordline-driver-circuitry 72 associated with a first deck (or base) 12 with wordlines of vertically stacked decks 14 and 16. The decks 14 and 16 are labeled as Deck-1 and Deck-2 in FIG. 16.

Figure 2:
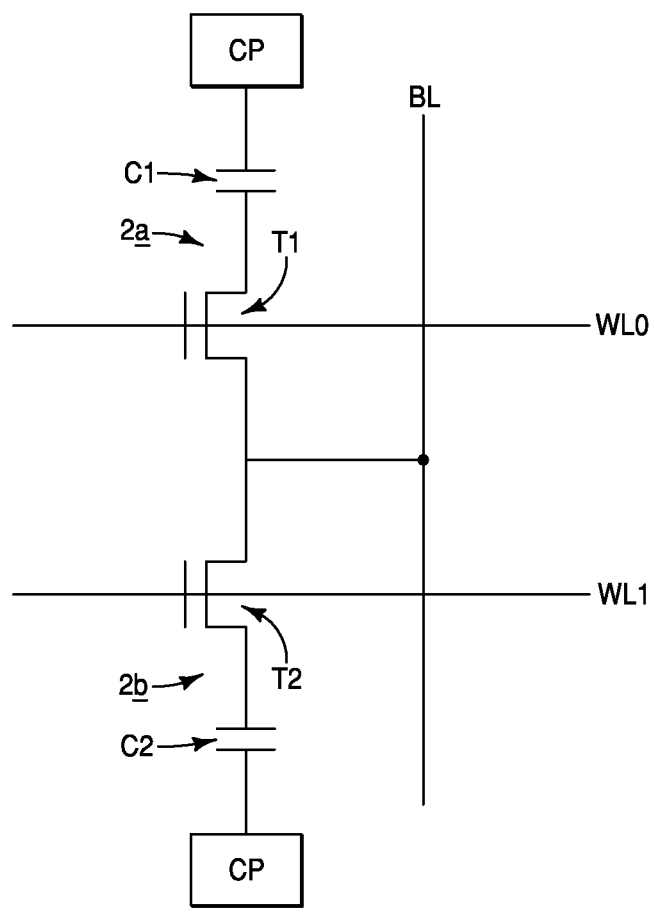
FIG. 2 is a schematic diagram of a pair of prior art memory cells which each have 1 transistor and 1 capacitor, and which share a bitline connection.

The second deck 14 is over the first deck 12, and comprises a first memory array 74a (Array-1) longitudinally offset from a second memory array 76a (Array-2). The memory arrays may be analogous to the arrays described above with reference to FIGS. 1-3.

Figure 3:
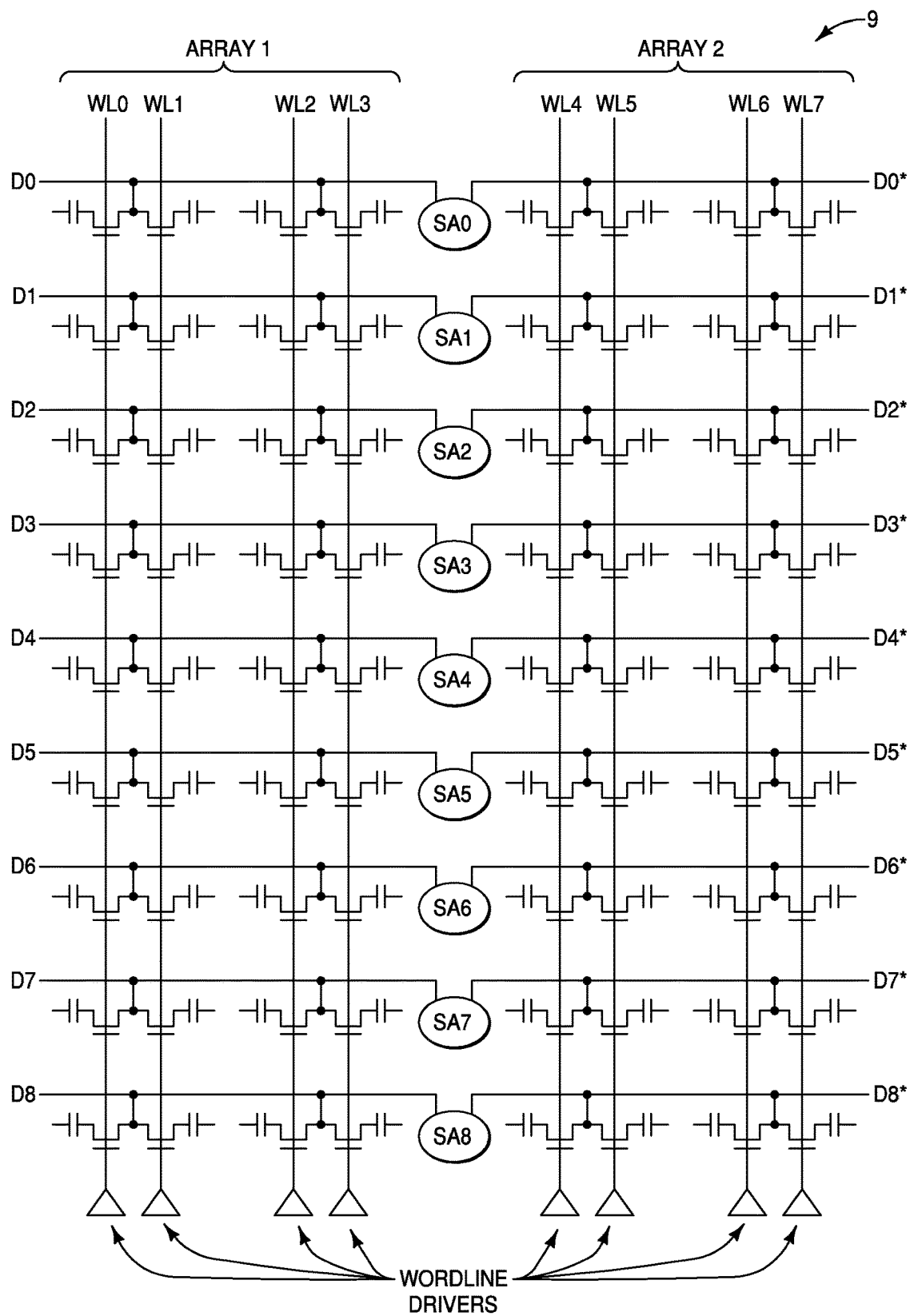
FIG. 3 is a schematic diagram of a prior art integrated assembly having open bitline architecture.

Wordlines extend from the first memory array 74a to the second memory array 76a; with an example wordline being shown as WL1a, and being analogous to the wordline WL1 of FIG. 3. The wordlines WL1a may be referred to as wordlines 46a analogous to the conductive lines 46 of FIG. 11. The wordlines along the deck 14 may be referred to as first wordlines.

The third deck 16 is over the second deck 14, and comprises a third memory array 74b (Array-1) longitudinally offset from a fourth memory array 76b (Array-2).

Wordlines extend from the third memory array 74b to the fourth memory array 76b; with an example wordline being shown as WL1b, and being analogous to the wordline WL1 of FIG. 3. The wordlines WL1b may be referred to as wordlines 46b analogous to the conductive lines 46 of FIG. 11. The wordlines along the deck 16 may be referred to as second wordlines.

A first connection region 48a is along the first wordlines 46a, and a second connection region 48b is along the second wordlines 46b. The connection regions 48a and 48b may be the same as the connection region 48 described above with first to FIGS. 7, 8 and 11; and accordingly the wordlines may bifurcate into paired components as they pass through the connection regions (e.g., may bifurcate into components analogous to the components 1t, 1b, etc., which were described above with reference to FIGS. 7, 8 and 11). The components of the first wordlines 46a may be referred to as first components, and the components of the second wordlines 46b may be referred to as second components.

A first opening 62a (analogous to the opening 62 of FIG. 11) passes vertically through the second deck 14 and through the first connection region 48a. The first opening breaks one of the paired first components of one of the first wordlines (e.g., breaks a component 1t of a wordline 1 analogous to the line 1 of FIG. 11) while leaving the other of the paired first components of said one of the first wordlines to carry a first signal across the first connection region 48a (e.g., while leaving the component 1b of the wordline 1).

A second opening 62b (analogous to the opening 62 of FIG. 11) passes vertically through the third deck 16 and through the second connection region 48b. The second opening breaks one of the paired second components of one of the second wordlines (e.g., breaks a component 1t of a wordline 1 analogous to the line 1 of FIG. 11) while leaving the other of the paired second components of said one of the second wordlines to carry a second signal across the first connection region 48b (e.g., while leaving the component 1b of the wordline 1).

A first vertical interconnect 78 couples to the wordline-driver-circuitry 72, extends through the first opening 62a and electrically couples with one of the first components passing through the first connection region 48a (such connection may be analogous to the connection 64 described above with reference to FIG. 7, and may be accomplished with a configuration analogous to that described below with reference to FIG. 17).

A second vertical interconnect 80 couples to the wordline-driver-circuitry 72, extends through the first opening 62a, extends through the second opening 62b, and electrically couples with one of the second components passing through the second connection region 48b (such connection may be analogous to the connection 64 described above with reference to FIG. 7, and may be accomplished with a configuration analogous to that described below with reference to FIG. 17).

The vertical interconnects (e.g., 78 and 80 of FIG. 16) may be coupled with wordline components utilizing any suitable configurations. In some embodiments, it may be desirable to couple the vertical interconnects with the top wordline components in that such wordline components may be easier to access than the bottom wordline components, particularly if some of the bottom wordline components are vertically stacked under the top wordline components. FIG. 17 shows an example configuration which may be utilized for coupling interconnects to wordline components.

Figure 17:
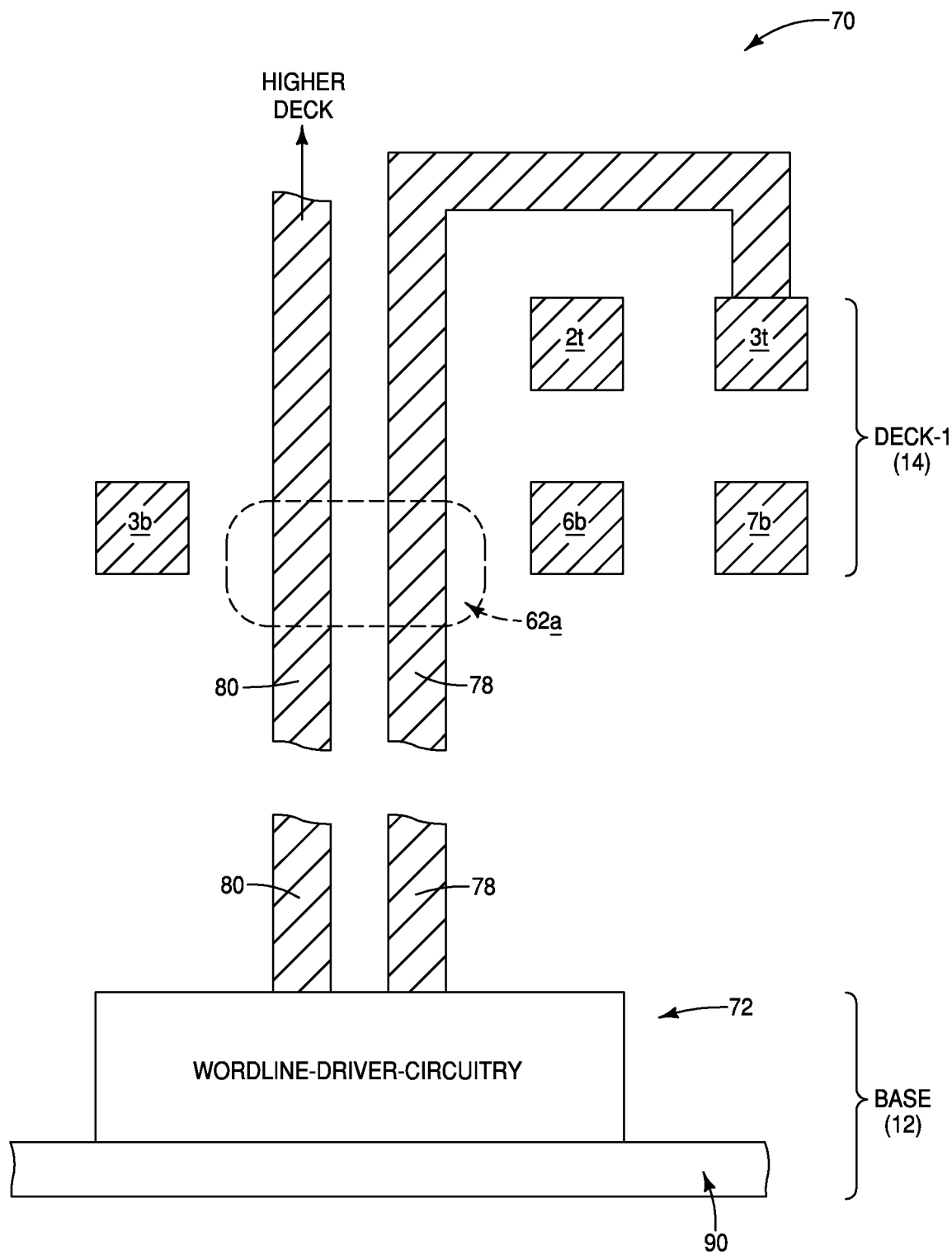
FIG. 17 is a diagrammatic cross-sectional side view of a region of an example integrated assembly.

FIG. 17 shows a region of the assembly 70 comprising the deck 14 over the base 12. The base 12 includes the wordline-driver-circuitry 72 supported by a substrate 90 (e.g., a semiconductor substrate). Interconnects 78 and 80 are shown to be electrically coupled with the wordline-driver-circuitry 72. The interconnects extend vertically through the opening 62a. The interconnect 80 continues upwardly toward the third deck 16 (shown in FIG. 16), while the interconnect 78 extends horizontally across the top components 2t and 3t of a couple of the wordlines (with example wordlines 46, 46a being shown in FIGS. 7, 8, 11 and 16), and electrically connects to the top component 3t.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a conductive line supported by a deck and extending along a longitudinal direction. The conductive line is configured to carry an electrical signal. A connection region is along the conductive line. The conductive line splits amongst multiple components as it passes through the connection region. The components are spread-apart from one another along a lateral direction which is orthogonal to the longitudinal direction. An opening extends vertically through the deck and through the connection region. The opening breaks one of the components of the conductive line to leave another of the components to carry the electrical signal across the connection region.

Some embodiments include an integrated assembly comprising a signal carrier structure supported by a deck and extending along a longitudinal direction. The signal carrier structure is configured to carry a signal. A connection region is along the signal carrier structure. The signal carrier structure splits amongst multiple components as it passes through the connection region, with said components being spread-apart from one another along a lateral direction which is orthogonal to the longitudinal direction. An opening extends vertically through the deck and through the connection region. The opening breaks one of the components of the signal carrier structure to leave another of the components to carry the signal across the connection region.

Some embodiments include an integrated assembly comprising lines of wiring supported by a deck and extending along a first direction. A connection region is along the lines. Each of the lines has a first end on one side of the connection region and has a second end on another side of the connection region. Each of the lines bifurcates into paired components as it passes through the connection region, with said paired components of each of the lines being spread-apart from one another along a second direction which is orthogonal to the first direction. An opening extends vertically through the deck and through the connection region. The opening breaks one of the paired components of one of the lines while leaving the other of the paired components of said one of the lines to carry a signal across the connection region.

Some embodiments include an integrated assembly which includes a first deck comprising first circuitry, a second deck over the first deck, and lines of wiring along the second deck. A connection region is along the lines. Each of the lines has a first end on one side of the connection region and has a second end on another side of the connection region. Each of the lines bifurcates into paired components as it passes through the connection region, with said paired components of each of the lines being spread-apart from one another. An opening extends vertically through the second deck and through the connection region. The opening breaks one of the paired components of at least one of the lines to leave the other of the paired components of said at least one of the lines to carry a signal across the connection region. A vertical interconnect is electrically coupled with the first circuitry of the first deck, extends through the opening, and is electrically coupled with an individual of the components passing through the connection region.

Some embodiments include an integrated assembly having a first deck which comprises wordline-driver-circuitry. A second deck is over the first deck and comprises a first memory array longitudinally offset from a second memory array. A third deck is over the second deck and comprises a third memory array longitudinally offset from a fourth memory array. First wordlines extend from the first memory array to the second memory array. A first connection region is along the first wordlines. Each of the first wordlines bifurcates into paired first components as it passes through the first connection region, with said paired first components of each of the first wordlines being laterally offset from one another. Second wordlines extend from the third memory array to the fourth memory array. A second connection region is along the second wordlines. Each of the second wordlines bifurcates into paired second components as it passes through the second connection region, with said paired second components of each of the second wordlines being laterally offset from one another. A first opening extends vertically through the second deck and through the first connection region. The first opening breaks one of the paired first components of one of the first wordlines to leave the other of the paired first components of said one of the first wordlines to carry a first signal across the first connection region. A second opening extends vertically through the third deck and through the second connection region. The second opening breaks one of the paired second components of one of the second wordlines to leave the other of the paired second components of said one of the second wordlines to carry a second signal across the second connection region. A first vertical interconnect which is electrically coupled with the wordline-driver-circuitry of the first deck, which extends through the first opening, and which is electrically coupled with an individual of the first components passing through the first connection region. A second vertical interconnect which is electrically coupled with the wordline-driver-circuitry of the first deck, which extends through the first opening, which extends through the second opening, and which is electrically coupled with an individual of the second components passing through the second connection region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An integrated assembly, comprising:
a signal carrier structure supported by a deck and extending along a longitudinal direction; the signal carrier structure being configured to carry a signal;
a connection region along the signal carrier structure; the signal carrier structure splitting amongst multiple components as it passes through the connection region, with said components being spread-apart from one another along a lateral direction which is orthogonal to the longitudinal direction; and
an opening passing vertically through the deck and through the connection region; the opening breaking one of the components of the signal carrier structure to leave another of the components to carry the signal across the connection region.

2. The integrated assembly of claim 1 wherein the signal carrier structure is a conductive line and wherein the signal is an electrical signal.

3. The integrated assembly of claim 2 wherein the conductive line is bifurcated into a pair of the components as it passes through the connection region.

4. The integrated assembly of claim 3 wherein the components of said pair of components are vertically offset relative to one another.

5. The integrated assembly of claim 3 wherein each of the components of said pair of components comprises metal.

6. The integrated assembly of claim 3 wherein the components of said pair of components comprise a same composition as one another.

7. The integrated assembly of claim 3 wherein the components of said pair of components comprise different compositions relative to one another.

8. An integrated assembly, comprising:
lines of wiring supported by a deck and extending along a first direction;
a connection region along the lines; each of the lines having a first end on one side of the connection region and a second end on another side of the connection region; each of the lines bifurcating into paired components as it passes through the connection region, with said paired components of each of the lines being spread-apart from one another along a second direction which is orthogonal to the first direction; and
an opening passing vertically through the deck and through the connection region; the opening breaking one of the paired components of one of the lines while leaving the other of the paired components of said one of the lines to carry a signal across the connection region.

9. The integrated assembly of claim 8 wherein the paired components of each of the lines are vertically offset relative to one another, with a first of the paired components of each of the lines being a top component and with a second of the paired components of each of the lines being a bottom component.

10. The integrated assembly of claim 9 wherein the lines include a first line and a second line; and wherein a top component of the first line is directly over the bottom component of the second line.

11. The integrated assembly of claim 9 wherein the top and bottom components comprise a same composition as one another.

12. The integrated assembly of claim 9 wherein the top and bottom components comprise different compositions relative to one another.

13. The integrated assembly of claim 8 wherein the lines and the paired components comprise metal.

14. The integrated assembly of claim 8 wherein the lines are parallel to one another at the first and second ends of the lines.

15. An integrated assembly, comprising:
a first deck comprising first circuitry;
a second deck over the first deck;
lines of wiring along the second deck;
a connection region along the lines; each of the lines having a first end on one side of the connection region and a second end on another side of the connection region; each of the lines bifurcating into paired components as it passes through the connection region, with said paired components of each of the lines being spread-apart from one another;
an opening passing vertically through the second deck and through the connection region; the opening breaking one of the paired components of at least one of the lines to leave the other of the paired components of said at least one of the lines to carry a signal across the connection region; and
a vertical interconnect electrically coupled with the first circuitry of the first deck, extending through the opening, and being electrically coupled with an individual of the components passing through the connection region.

16. The integrated assembly of claim 15 wherein the lines are on a pitch, and wherein the paired components are on the pitch.

17. The integrated assembly of claim 15 wherein the first circuitry is wordline-driver-circuitry, and wherein the lines are wordlines.

18. The integrated assembly of claim 15 wherein the paired components of each of the lines are vertically offset relative to one another and are a top component and a bottom component.

19. The integrated assembly of claim 18 wherein the top component of one of the lines is directly over the bottom component of another of the lines.

20. The integrated assembly of claim 18 wherein said individual of the components electrically coupled with the vertical interconnect is a top component.

21. The integrated assembly of claim 15 comprising a third deck over the second deck; wherein the vertical interconnect is a first vertical interconnect; and further comprising a second vertical interconnect electrically coupled with the first circuitry, and extending through the opening and to the third deck.

22. The integrated assembly of claim 21 wherein the lines are first lines, the connection region is a first connection region, the opening is a first opening; and further comprising:
second lines of wiring along the third deck;
a second connection region along the second lines;
a second opening extending through the second connection region; and
the second vertical interconnect extending through the second opening and being coupled with one of the second lines.

23. The integrated assembly of claim 22 wherein the first circuitry is wordline-driver-circuitry, and wherein the first and second lines are wordlines.

24. An integrated assembly, comprising:
a first deck comprising wordline-driver-circuitry;
a second deck over the first deck and comprising a first memory array longitudinally offset from a second memory array;
a third deck over the second deck and comprising a third memory array longitudinally offset from a fourth memory array;
first wordlines extending from the first memory array to the second memory array;
a first connection region along the first wordlines; each of the first wordlines bifurcating into paired first components as it passes through the first connection region, with said paired first components of each of the first wordlines being laterally offset from one another;
second wordlines extending from the third memory array to the fourth memory array;
a second connection region along the second wordlines; each of the second wordlines bifurcating into paired second components as it passes through the second connection region, with said paired second components of each of the second wordlines being laterally offset from one another;
a first opening passing vertically through the second deck and through the first connection region; the first opening breaking one of the paired first components of one of the first wordlines to leave the other of the paired first components of said one of the first wordlines to carry a first signal across the first connection region;
a second opening passing vertically through the third deck and through the second connection region; the second opening breaking one of the paired second components of one of the second wordlines to leave the other of the paired second components of said one of the second wordlines to carry a second signal across the second connection region;

a first vertical interconnect electrically coupled with the wordline-driver-circuitry, extending through the first opening, and being electrically coupled with an individual of the first components passing through the first connection region; and a second vertical interconnect electrically coupled with the wordline-driver-circuitry, extending through the first opening, extending through the second opening, and being electrically coupled with an individual of the second components passing through the second connection region.

25. The integrated assembly of claim 24 wherein the paired first components of each of the first wordlines are vertically offset relative to one another, and are a top component and a bottom component.

26. The integrated assembly of claim 25 wherein the top component of one of the first wordlines is directly over the bottom component of another of the first wordlines.

27. The integrated assembly of claim 25 wherein said individual of the first components is a top component.

28. The integrated assembly of claim 25 wherein the top and bottom components comprise a same composition as one another.

29. The integrated assembly of claim 25 wherein the top and bottom components comprise different compositions relative to one another.

30. The integrated assembly of claim 24 wherein the paired second components of each of the second wordlines are vertically offset relative to one another, and are a top component and a bottom component.

31. The integrated assembly of claim 30 wherein the top component of one of the second wordlines is directly over the bottom component of another of the second wordlines.

32. The integrated assembly of claim 30 wherein said individual of the second components is a top component.

33. The integrated assembly of claim 30 wherein the top and bottom components comprise a same composition as one another.

34. The integrated assembly of claim 30 wherein the top and bottom components comprise different compositions relative to one another.

35. The integrated assembly of claim 24 wherein:
the paired first components of each of the first wordlines are vertically offset relative to one another; and
the paired second components of each of the second wordlines are vertically offset relative to one another.

* * * * *